(12) United States Patent
Mergens et al.

(10) Patent No.: US 12,414,382 B2
(45) Date of Patent: Sep. 9, 2025

(54) ESD PROTECTION DEVICE

(71) Applicant: NEXPERIA B.V., Nijmegen (NL)

(72) Inventors: Markus Mergens, Nijmegen (NL);
Hans-Martin Ritter, Nijmegen (NL);
Ansgar Thorns, Nijmegen (NL)

(73) Assignee: NEXPERIA B.V., Nijmgegen (NL)

( * ) Notice: Subject to any disclaimer, the term of this patent is extended or adjusted under 35 U.S.C. 154(b) by 129 days.

(21) Appl. No.: 17/993,173

(22) Filed: Nov. 23, 2022

(65) Prior Publication Data
US 2023/0163118 A1 May 25, 2023

(30) Foreign Application Priority Data

Nov. 25, 2021 (EP) .................................. 21210382

(51) Int. Cl.
*H10D 89/60* (2025.01)
*H01L 23/00* (2006.01)
*H02H 9/02* (2006.01)

(52) U.S. Cl.
CPC ............ *H10D 89/814* (2025.01); *H02H 9/02* (2013.01); *H10D 89/611* (2025.01);
(Continued)

(58) Field of Classification Search
CPC ............ H01L 27/0274; H01L 27/0255; H01L 27/0262; H01L 27/0288; H01L 24/16;
(Continued)

(56) References Cited

U.S. PATENT DOCUMENTS 9,007,732 B2 * 4/2015 Bertin .................. H10D 89/811
361/91.1
11,664,658 B2 * 5/2023 Morf .................... H10D 89/911
361/56
(Continued)

FOREIGN PATENT DOCUMENTS

CN 204156065 U * 2/2015 ......... H01F 27/2804
CN 214850612 U * 11/2021

OTHER PUBLICATIONS

Extended European Search Report for corresponding European application EP21210382.4, 9 pages dated May 3, 2022.
(Continued)

*Primary Examiner* — Dharti H Patel
(74) *Attorney, Agent, or Firm* — Ruggiero McAllister & McMahon LLC

(57) ABSTRACT

A protection device is provided for protecting an electrostatic discharge (ESD), sensitive device against an electromagnetic interference (EMI), event and/or an ESD event occurring on at least one of a first and second data line the ESD sensitive device is electrically connected to. Aspects of the present disclosure further relate to a system including an ESD sensitive device that is operatively coupled to a further device using a first and second data line, and the system includes the abovementioned protection device. The protection device uses a first inductor and/or second inductor and a first and/or shunt unit that each provide an electrical path between the first data line and/or second data line and ground in dependence of a voltage over the first and/or second inductor.

19 Claims, 4 Drawing Sheets

(52) U.S. Cl.
CPC ......... *H10D 89/713* (2025.01); *H10D 89/911* (2025.01); *H01L 24/16* (2013.01); *H01L 24/48* (2013.01); *H01L 2224/16225* (2013.01); *H01L 2224/48225* (2013.01)

(58) Field of Classification Search
CPC ........... H01L 24/48; H01L 2224/16225; H01L 2224/48225; H02H 9/02; H02H 9/046; H02M 1/44
USPC .......................................................... 361/91.1
See application file for complete search history.

(56) References Cited

U.S. PATENT DOCUMENTS

| | | | | |
|---|---|---|---|---|
| 11,750,000 | B2 * | 9/2023 | Sung | H02J 1/08 361/18 |
| 11,775,645 | B2 * | 10/2023 | Januszewski | G06F 21/57 361/91.7 |
| 2004/0042141 | A1 * | 3/2004 | Mikolajczak | H05K 1/141 361/103 |
| 2008/0144248 | A1 * | 6/2008 | Crawley | H02H 3/023 361/111 |
| 2008/0165460 | A1 * | 7/2008 | Whitby-Strevens | H02H 9/004 361/86 |
| 2010/0067154 | A1 * | 3/2010 | Deng | H10D 89/60 361/56 |
| 2013/0293992 | A1 * | 11/2013 | Duvvury | H05K 1/0259 29/825 |
| 2015/0028460 | A1 * | 1/2015 | Sharma | H10D 89/911 257/664 |
| 2015/0041953 | A1 * | 2/2015 | Chen | H01L 21/04 438/381 |
| 2015/0162744 | A1 * | 6/2015 | Liu | H01F 27/29 361/111 |
| 2018/0069396 | A1 | 3/2018 | Schuett et al. | |
| 2019/0214380 | A1 * | 7/2019 | Lin | H10D 89/911 |
| 2019/0296005 | A1 | 9/2019 | Poveda et al. | |
| 2021/0175706 | A1 * | 6/2021 | Nagatani | H01L 23/60 |
| 2023/0238797 | A1 * | 7/2023 | Langguth | H02H 9/041 361/111 |
| 2023/0261462 | A1 * | 8/2023 | Zhang | H02H 9/02 361/93.9 |

OTHER PUBLICATIONS

Kranthi et al. "Insights Into the System-Level IEC ESD Failure in High Voltage DeNMOS-SCR for Automotive Applications" 2020 42 Annual EOS/ESD Symposium (EOS/ESD) EOS/ESD Association, Sep. 13, 2020.

Lepkowski "An Introduction to Transient Voltage Suppression Devices", Semiconductor Components Industries LLC, Jul. 2005, Publication Order No. AND8229/D.

* cited by examiner

ESD PROTECTION DEVICE

CROSS REFERENCE TO RELATED APPLICATION

This application claims the benefit under 35 U.S.C. § 119(a) of European Application No. 21210382.4 filed Nov. 25, 2021, the contents of which are incorporated by reference herein in their entirety.

BACKGROUND OF THE DISCLOSURE

1. Field of the Disclosure

Aspects of the present disclosure relate to a protection device for protecting an electrostatic discharge, ESD, sensitive device. The ESD sensitive device is electrically connected to at least one among a first data line and a second data line. The protection device is configured for protecting the ESD sensitive device against an electromagnetic interference, EMI, event and/or an ESD event occurring on the first data line and/or second data line. Aspects of the present disclosure further relate to a system comprising an physical layer device that is operatively coupled to a further device using a first data line and/or second data line, wherein the system comprises the abovementioned protection device.

2. Description of the Related Art

A major challenge for system-level ESD protection of advanced high-speed interfaces such as USB4 with up to 40 Gbit/s aggregate bandwidth is the protection of the sensitive RF data-lines with a transceiver/receiver in the physical layer, PHY, device. For the system-level discrete ESD protection, an ultra-low trigger voltage is required to avoid detrimental overstress and damage of the high-speed I/O transistors of the physical layer device.

Most currently available high-speed interfaces are based on differential signaling in which a first and second data line are used to transport data. These data lines are connected to a first and second data terminal of the PHY device.

To provide sufficient protection, on-chip and off-chip ESD protection is commonly employed. The on-chip ESD protection is formed using generally known components, such as on-chip resistors, diodes, bipolar transistors, silicon controlled rectifiers, 'SCRs', silicon controlled switches, 'SCSs', and/or MOS-based ESD circuits, which are integrated on the semiconductor die of the PHY device. The PHY device is mounted on a carrier, such as a printed circuit board, on which the first and data lines are arranged. On this same carrier, off-chip ESD protection devices are provided that provide an electrical path to ground provided that the voltage on the first and second data lines either exceeds a given positive threshold voltage or is smaller than a given negative threshold voltage.

A general ESD protection issue on system-level concerns the trigger competition between the abovementioned off-chip and on-chip ESD protection due to unwanted turn-on of the more sensitive PHY ESD on-chip protection potentially resulting in premature system damage. In particularly critical for the occurrence of this issue is the first fast current peak of the IEC61000-4-2 "GUN" test with a high, pre-charge dependent peak current amplitude of Ip ~1.75 A/kV. Here, the off-chip ESD protection needs to trigger and clamp the ESD voltage sufficiently fast.

Transient clamping is particularly critical for RF optimized ESD protection devices with a low parasitic capacitance. The drawback of those devices is the slow turn-on speed due to conductivity modulation. Often ultra-low-capacitance devices (<500 fF) are required to ensure RF signal integrity. Those integrate lowly doped epi-regimes to minimize the junction capacitance, which can further slow-down triggering speed.

The large turn-on time of the off-chip ESD protection devices results in a high transient trigger voltage overshoot during the first spike of a system-level GUN pulse due to the fast current slew-rate mentioned above. This kind of overvoltage is exposed to the system and can damage the sensitive RF interface of the PHY device.

SUMMARY

According to an aspect of the present disclosure an ESD protection device is provided that does not suffer from the abovementioned problem(s) or at least to a lesser extent. This protection device comprises a first inductor via which the first data line is electrically connected to a first data terminal of the ESD sensitive device, and/or a second inductor via which the second data line is electrically connected to a second data terminal of the ESD sensitive device. The protection device further comprises a first shunt unit configured for providing an electrical path to ground for a current on the first data line in dependence of a first voltage over the first inductor, and/or a second shunt unit configured for providing an electrical path to ground for a current on the second data line in dependence of a second voltage over the second inductor.

According to an aspect of the present disclosure, a voltage over an inductor is used to trigger a shunt unit. As the voltage over the inductor depends on the time-derivative of the current that passes through it, relatively high voltages are generated during sharp current peaks, such as those generated during an ESD event. The Applicant has found that for at least some applications a relatively small inductance value is sufficient for providing proper triggering of the shunt unit while at the same time providing a sufficiently low impedance that does not disturb signal propagation over the relevant data line during normal operation.

The present disclosure relates to protection devices for ESD sensitive devices, which ESD sensitive devices are communicatively connected to a further device for exchanging data using at least one data line. This at least one data line may include the first data line and/or the second data line. Some embodiments of the present disclosure relate to protection devices for ESD sensitive devices, which ESD sensitive devices are communicatively connected to a further device for exchanging data using a first data line and a second data line.

When the ESD sensitive device uses differential signaling for exchanging data with the further device, both the first and second data line are used. In this case, the transferred data depends on a voltage difference between the voltage on the first and second data lines rather than a voltage difference between the voltage on the first or second data line and a reference potential, such as ground. When differential signaling is used, the first inductor and second inductor may jointly form a common mode choke, CMC, or may jointly be part of a CMC. The first inductor and the second inductor of the CMC are inductively coupled such that when a common mode current flows through both inductors, the magnetic flux generated by one inductor adds constructively with the magnetic flux generated by the other inductor. Conversely, when a differential mode current flows through both inductors, the magnetic flux generated by one inductor adds destructively with the magnetic flux generated by the other inductor. Consequently, the effective impedance of the CMC for differential mode signals is very low, whereas the effective impedance of the CMC for common mode signals is very high. Consequently, with a CMC, it is possible to use relatively high inductance values without deteriorating the RF integrity of the first and second data lines. With these high inductance values, it becomes possible to reach the desired voltage to trigger the on-set of the electrical paths to ground of the shunt unit(s) at even lower currents flowing through the first and/or second data lines during an ESD or EMI event, thereby preventing or limiting high peak voltages in the ESD sensitive device.

Within the context of the present disclosure, the first inductor and/or second inductor can be connected to the first data line and/or second data line on both ends of the first inductor and/or second inductor, respectively. In these embodiments, the first data line and/or second data line each comprise a first part arranged in between the ESD sensitive device and the respective inductor and a second part arranged in between this respective inductor and the further device to which the ESD sensitive device is connected. In other embodiments, the first inductor and/or second inductor is/are directly connected to the first and second data terminals of the ESD sensitive device, respectively.

The first shunt unit can be configured for providing the electrical path to ground if the first voltage exceeds or has exceeded a first threshold voltage. Additionally, or alternatively, the second shunt unit can be configured for providing the electrical path to ground if the second voltage exceeds or has exceeded a second threshold voltage. This configuration protects against positive peak voltages on the first and/or second data and ESD sensitive device line during a positive ESD or EMI event.

The first shunt unit may be configured for providing the electrical path to ground if the first voltage drops or has dropped below a third threshold voltage. Additionally, or alternatively, the second shunt unit can be configured for providing said electrical path to ground if the second voltage drops or has dropped below a fourth threshold voltage. Here, the third and fourth threshold voltages are typically negative voltages. This configuration protects against negative peak voltages on the first and/or second data line and ESD sensitive device during a negative ESD or EMI event.

Typically, the first shunt unit and/or second shunt unit use different thresholds for establishing and breaking the electrical path such that the electrical path is maintained for some time after the relevant threshold voltage has been reached.

The protection device may comprise a first input terminal that is electrically connected to the first data line and a first output terminal that is electrically connected to the first data terminal of the ESD sensitive device, wherein the first inductor is arranged in between the first input terminal and the first output terminal. Additionally, or alternatively, the protection device may comprise a second input terminal that is electrically connected to the second data line and a second output terminal that is electrically connected to the second data terminal of the ESD sensitive device, wherein the second inductor is arranged in between the second input terminal and the second output terminal. The protection device may further comprise a ground terminal configured to be electrically grounded during operation.

The first shunt unit and/or the second shunt unit may comprise a silicon-controlled rectifier, SCR, a silicon-controlled switch, SCS, a thyristor, or a triac. At least one of the first shunt unit and the second shunt unit may comprise at least one shunt sub-unit. The at least one shunt sub-unit may comprise a first bipolar transistor, and a second bipolar transistor. An emitter contact of the first bipolar transistor is connected to a first shunt sub-unit terminal, a base contact of the first bipolar transistor is connected to a second shunt sub-unit terminal via a first resistor and to a collector contact of the second bipolar transistor, wherein a collector contact of the first bipolar transistor is connected to a base contact of the second bipolar transistor, wherein the base contact of the second bipolar transistor is connected to a third shunt sub-unit terminal via a second resistor, and wherein an emitter contact of the second bipolar transistor is connected to the third shunt sub-unit terminal. The shunt sub-units are each configured for providing an electrical path for a current on the first or second data line that extends through a base-emitter junction of the first bipolar transistor and crosses between the collector and emitter contacts of the second bipolar transistor.

For a given shunt sub-unit among the at least one shunt sub-unit of the first shunt unit, the first inductor can be connected in between the first and second shunt sub-unit terminals of said given shunt sub-unit. Similarly, for a given shunt sub-unit among the at least one shunt sub-unit of the second shunt unit, the second inductor can be connected in between the first and second shunt sub-unit terminals of said given shunt unit.

For a given shunt sub-unit among the at least one shunt sub-unit of the first shunt unit, the third shunt sub-unit terminal can be configured to be grounded during operation, and for a given shunt sub-unit among the at least one shunt sub-unit of the second shunt unit, the third shunt sub-unit terminal can be configured to be grounded during operation.

The first shunt unit may comprise a respective triggering unit for each of the at least one shunt sub-units of the first shunt unit, the triggering units each being configured for providing and/or extracting a triggering current at the base contact of the second bipolar transistor of the respective shunt sub-unit in dependence of a voltage over the first inductor being greater than the first threshold voltage or smaller than the third threshold voltage. Additionally, or alternatively, the second shunt unit may comprise a respective triggering unit for each of the at least one shunt sub-units of the second shunt unit, the triggering units each being configured for providing and/or extracting a triggering current at the base contact of the second bipolar transistor of the respective shunt sub-unit in dependence of a voltage over the second inductor being greater than the second threshold voltage or smaller than the fourth threshold voltage.

The triggering units may comprise a third bipolar transistor of which the collector contact is connected to the base contact of the relevant second bipolar transistor, and wherein the first inductor is arranged in between an emitter contact and base contact of the third bipolar transistor.

By using a PNP as the third bipolar transistor, a current can be provided or inserted to the base contact of the second bipolar transistor. This solution is suitable for suppressing voltage spikes on the data lines and in the ESD sensitive device in case of a positive ESD or EMI voltage pulse. Alternatively, by using a NPN as the third bipolar transistor, a current can be extracted at the base contact of the second bipolar transistor. This solution is suitable for suppressing voltage spikes on the data lines and in the ESD sensitive device in case of a negative ESD or EMI voltage pulse.

Instead of using bipolar transistors, metal-oxide-semiconductor, MOS, transistors can equally be used. In that case, the third bipolar transistor mentioned above is replaced by a MOS transistor. More in particular, the NPN transistor would be replaced by NMOS transistor and the PNP transistor by a PMOS transistor. Furthermore, the emitter, collector, and base of the bipolar transistor would correspond to the source, drain, and gate of the MOS transistor, respectively.

In case the first shunt unit comprises a single shunt sub-unit, the first shunt sub-unit terminal is connected to the first input terminal, the second shunt sub-unit terminal to the first output terminal, and the third shunt sub-unit terminal to the ground terminal. Similarly, in case the second shunt unit comprises a single shunt sub-unit, the first shunt sub-unit terminal is connected to the second input terminal, the second shunt sub-unit terminal to the second output terminal, and the third shunt sub-unit terminal to the ground terminal.

Alternatively, the shunt sub-units may each comprise a diode arranged in between the first or second shunt sub-unit terminal and the third shunt sub-unit terminal. This diode is configured to provide an additional electrical path in forward mode of the diode that is opposite in direction to the electrical path provided by that shunt sub-unit. In this case, at least one of the first and second shunt unit may comprise a series combination of a pair of shunt sub-units wherein the diodes of these shunt sub-units are oppositely arranged. Such series combination allows a single shunt unit to provide an electrical path for both positive and negative pulses on the first or second data line in case of an ESD or EMI event. In case of a positive voltage pulse, the diode of one shunt sub-unit will be in the forward mode whereas the other shunt sub-unit will be triggered to provide the electrical path between the third and first or second shunt sub-unit terminals. Typically, in these embodiments, the type of the bipolar transistors used in the various shunt sub-units is reversed. For example, the first bipolar transistor of one shunt sub-unit may be an NPN transistor and for the other shunt sub-unit a PNP transistor. For the second bipolar transistor the situation would be reversed.

In other embodiments, for example embodiments in which the shunt sub-units are not provided with diodes, shunt sub-units for providing an electrical path in case of a positive and negative pulse can be put in parallel.

According to a further aspect of the present disclosure, a system is provided that comprises a physical layer, PHY, device, having a first data terminal and/or a second data terminal, a first data line and/or a second data line by which the first and/or second data terminal of the PHY device can be connected to a further device, respectively, for exchanging data with the PHY device. The system further comprises the protection device as described above for protecting the PHY device against an electromagnetic interference, EMI, event and/or an ESD event occurring on at least one of the first and second data line.

The system may further comprise one or more first further protection devices that are connected to the first and/or second data terminal and that are arranged in between the protection device and the PHY device. Such first further protection devices may comprise shunt ESD devices such as a stack of diodes, bipolar transistors, SCRs, SCSs, and ESD circuits made thereof. The system may further comprise DC blocking capacitors arranged in between the one or more first protection devices and the protection device. The DC blocking capacitor forms a high-pass filter that only allows RF frequencies to pass through with minimum impedance for the desired RF signals. On the other hand, they block undesired DC signals from entering the PHY device.

The system may comprise a printed circuit board on which the protection device and the PHY device are mounted, wherein the protection device and/or the PHY device are provided, at least in part, as a bare semiconductor die that is flip-chipped or wire bonded to the printed circuit board. When the one or more first further protection devices are used, they can also be arranged on the printed circuit board. This also holds for the optional DC blocking capacitors.

The first inductor and/or second inductor can be integrated on a same semiconductor die as the first and/or second shunt units, respectively. Additionally, or alternatively, the first and/or second shunt units are preferably integrated on the same semiconductor die.

The system may further comprise one or more second protection devices that are arranged in the PHY device and that are connected to the first and/or second data terminals. These second protection devices may include diodes, bipolar transistors, SCRs, SCSs, MOS transistors, and ESD circuits made thereof.

The PHY device and protection device can each be entirely realized on respective semiconductor dies. These dies can either be mounted as a bare die or the dies may be packaged before mounting the packaged dies on the printed circuit board. For example, the protection device may be provided as a surface mounted device, 'SMD'.

The PHY device may comprise the abovementioned first data terminal and second data terminal. In this case, the PHY device can be configured to exchange data with the further device based on differential signaling. The first inductor and second inductor of the protection device may then jointly form or may be part of a common mode choke, CMC.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
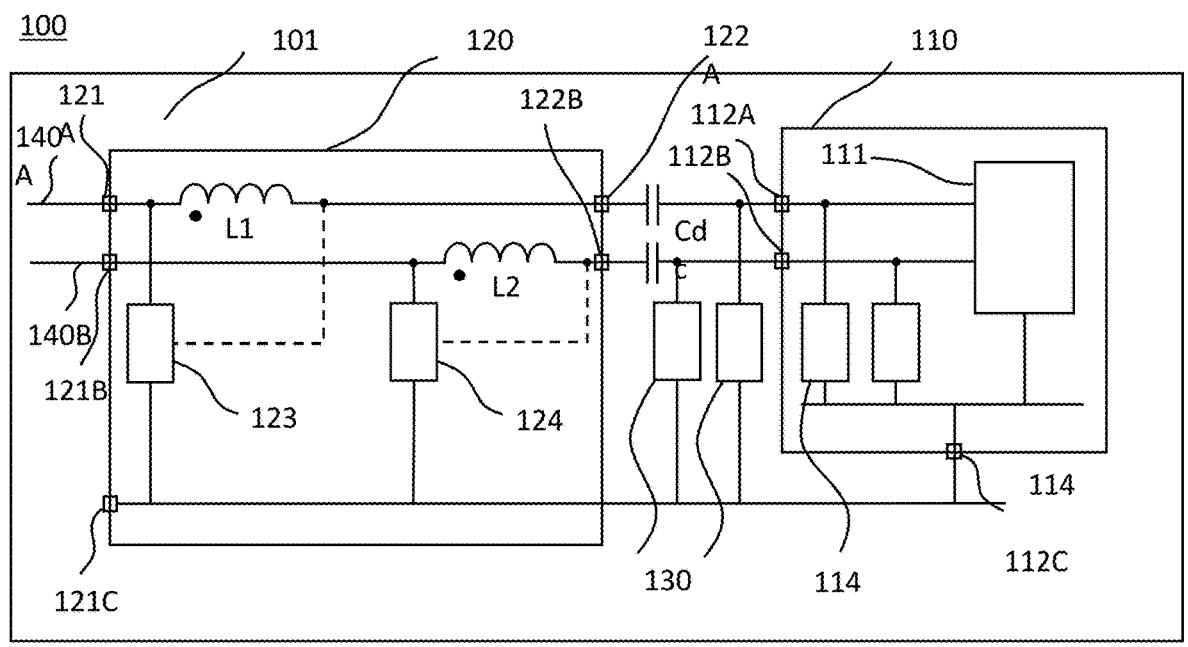
FIG. 1 illustrates an embodiment of a system in accordance with an aspect of the present disclosure.

FIG. 1 illustrates a system 100 in accordance with an aspect of the present disclosure. System 100 comprises a printed circuit board 101 on which an ESD sensitive PHY device 110 and a protection device 120 are mounted. Both PHY device 110 and protection device 120 comprise semiconductor dies that are bare mounted to printed circuit board 101, for example using wire bonding or flip-chip bonding.

PHY device 110 comprises transmit/receive circuitry 111 that is connected to a first data terminal 112A and a second data terminal 112B of PHY device 120. PHY device 110 further comprises a ground terminal 112C. Protection devices 114 are arranged on the same semiconductor die as circuitry 111. Protection devices 114 are arranged in between first data terminal 112A and ground and in between second data terminal 112B and ground. Protection devices 114, such as diodes, bipolar transistors, SCRs, SCSs, and ESD circuits made thereof, protect sensitive circuitry 111 against high voltage peaks that may occur during an ESD or EMI event on data lines 140A, 140B by which PHY device 110 is connected to a further device (not shown). This further device could also be arranged on printed circuit board 101. Alternatively, the further device is remote from printed circuit board 101.

Further protection devices 130, such as diodes, bipolar transistors, SCRs, SCSs, and ESD circuits made thereof, are optionally mounted on printed circuit board 101. Protection devices 130 are electrically connected, either directly or via a metal track or the like, to data terminals 112A, 112B. In addition, protection devices 130 are coupled via DC blocking capacitors Cdc to a first output terminal 122A and second output terminal 122B of protection device 120.

Protection device 120 further comprises a first input terminal 121A that is connected to first data line 140A, and a second input terminal 121B that is connected to second data line 140B. On the semiconductor die of protection device 120, a first inductor L1 and a second inductor L2 are integrated. Inductors L1 and L2 are inductively coupled and jointly form a common mode choke, CMC. As shown in FIG. 1, inductor L1 is arranged in between first input terminal 121A and first output terminal 122A, and inductor L2 is arranged in between second input terminal 121B and second output terminal 122B. Protection device 120 also comprises a first shunt unit 123 and a second shunt unit 123, which will be described in more detail using FIGS. 2A, 2B, 3A, 3B, and 4.

Shunt unit 123 is configured to provide an electrical path between first input terminal 121A and ground terminal 121C when a voltage on first data line 140A exceeds a given positive threshold voltage and when this voltage drops below a given negative threshold voltage. Similarly, shunt unit 124 is configured to provide an electrical path between second input terminal 121B and ground terminal 121C when a voltage on second data line 140B exceeds a given positive threshold voltage and when this voltage drops below a given negative threshold voltage.

In case shunt units 123, 124 are only configured to provide an electrical path in dependence of a single threshold voltage, for example for addressing positive or negative ESD events, another shunt unit could be arranged in parallel for addressing the other type of ESD event.

As indicated using the dashed lines in FIG. 1, shunt units 123 and 124 are controlled by monitoring a voltage over inductors L1 and L2. More in particular, shunt unit 123 provides the electrical path to ground when the voltage over L1 exceeds a first positive threshold voltage, and when this voltage drops below a third negative threshold voltage, and shunt unit 124 provides the electrical path when the voltage over L2 exceeds a second positive threshold voltage, and when the voltage drops below a fourth negative threshold voltage.

As a result of the common mode choke configuration of inductors L1 and L2, common mode signals on data lines 140A, 140B are blocked by the relatively high effective impedance seen on each data line 140A, 140B. However, data communication of system 100 is based on differential signaling. For differential signals, the magnetic flux generated in one coil is compensated, at least partially, by the magnetic flux generated in the other coil. As a result, the effective impedance associated with the CMC seen on each data line 140A, 140B is relatively low.

Although FIG. 1 illustrates a protection device in which a first and second inductor are used that jointly form a CMC, the present disclosure is not limited to such protection devices. The present disclosure equally relates to embodiments in which only a single data line is used, to embodiments in which a first and second data line is used but which data lines do not form a CMC, and to embodiments in which more than two data lines are used. For these latter embodiments, the protection device can be configured to protect the PHY device against ESD or EMI events occurring on at least one these data lines in the manner described in the present disclosure.

Next, embodiments of shunt unit 123 will be described referring to FIGS. 2A, 2B, 3A, 3B and 4. It should be noted that these embodiments may equally be used as shunt unit 124. More in particular, shunt units 123 and 124 may be identical.

Figure 2A:
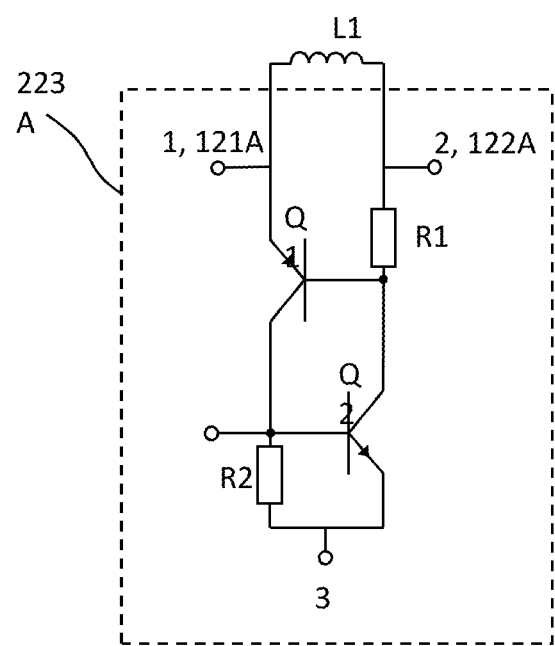
FIGS. 2A-2B illustrate two embodiments of a protection device in accordance with an aspect of the present disclosure in which internal triggering is used.

FIG. 2A illustrates a shunt unit 223A of a protection device with internal triggering. Shunt unit 223A comprises a single shunt sub-unit. This shunt sub-unit comprises a first PNP bipolar transistor Q1 of which the emitter is connected to first shunt sub-unit terminal 1, and of which the base is connected via a resistor R1 to second shunt sub-unit terminal 2. The base of Q1 is also connected to the collector of a second NPN bipolar transistor Q2. The emitter of this latter transistor is connected to third shunt sub-unit terminal 3. The base of Q2 is connected via a resistor R2 to third shunt sub-unit terminal 3 and to the collector of Q1.

First shunt sub-unit terminal 1 is connected to first data line 140A via first input terminal 121A, and second shunt sub-unit terminal 2 connected to second data terminal 112A via first output terminal 122A. Third shunt sub-unit terminal 3 is connected to ground terminal 121C and is electrically grounded during operation.

During a positive ESD event on data line 140A, a current will start to flow from first input terminal 121A, through L1, Cdc, and through protection device 114 to ground terminal 112C. As a result of the increase in current through L1, a voltage will build up over L1. If this voltage is sufficiently high, the base-emitter junction of Q1 will be forward biased, and a current will flow from the emitter of Q1 to the collector of Q1 and through resistor R2. If this current is sufficiently high, the base-emitter junction of Q2 will be forward biased allowing a collector current to flow through Q2. This will strengthen the forward biasing of the base-emitter junction of Q1. In this situation, a current path is provided that extends from the emitter of Q1 through the base emitter junction and that extends between the collector and emitter of Q2, and that activates a regenerative action of coupled Q1 and Q2, which is typical for an SCR shunt.

Figure 2B:
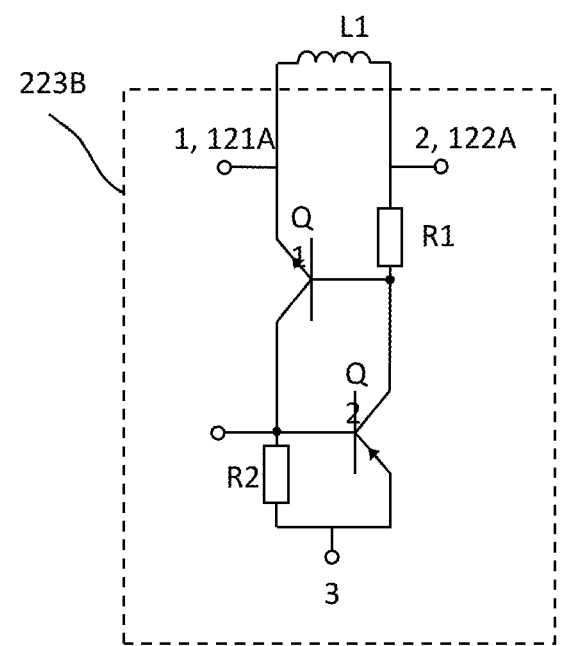
Figure 3A:
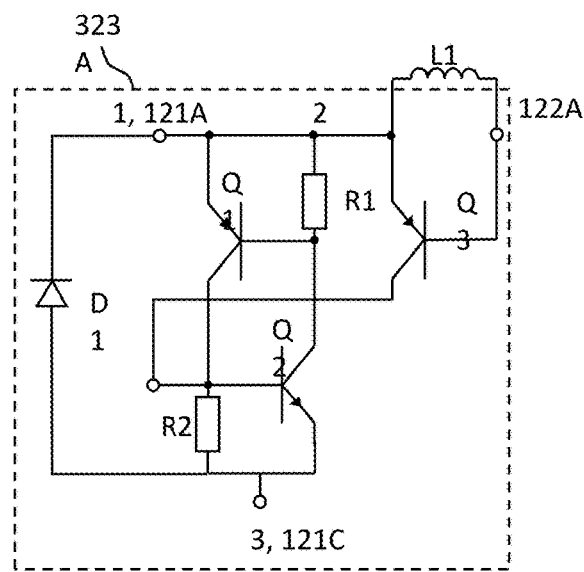
FIGS. 3A-3B illustrate two embodiments of a protection device in accordance with an aspect of the present disclosure in which external triggering is used.
Figure 3B:
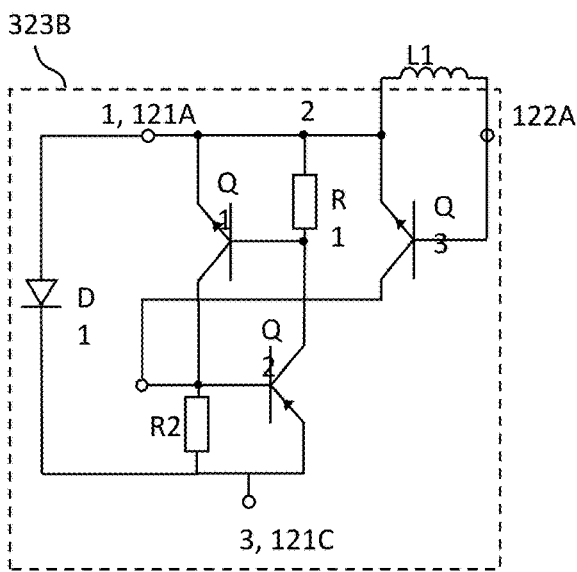

Shunt unit 223B shown in FIG. 2B will operate similarly to shunt unit 223A with the exception that it is configured to handle negative ESD events. To that end, the NPN and PNP are reversed compared with shunt unit 223A. In case of a negative ESD event, a rapidly increasing current will flow from ground terminal 112C, through protection device 114, Cdc, and inductor L1. Provided the voltage drop over L1 is sufficiently high, the base emitter junction of Q2 will be forward biased and a current will flow through R2 that in turn will forward bias the base emitter junction of Q2. Consequently, a current will flow from the emitter of Q2 to the collector of Q2 and through the base emitter junction of Q1, and that activates a regenerative action of coupled Q1 and Q2, which is typical for an SCR shunt.

Shunt units 223A, 223B use an internal triggering. Shunt units 323A and 323B, shown in FIGS. 3A and 3B, respectively, use an external triggering formed using a third bipolar transistor Q3. Inductor L1 is arranged in between the emitter and base contacts of Q3. Similar to shunt units 223A, 223B, the base emitter junction of Q3 is forward biased. For shunt unit 323A, a current is injected at the base contact of Q2 where it will flow through R2 thereby forward biasing the base emitter junction of Q2. For shunt unit 323B, a current is extracted at the base contact of Q2 thereby forward biasing the base emitter junction of Q3. In both cases, a current will flow through R1 after forward biasing the base emitter junction of Q2 thereby establishing the same electrical path as for shunt units 223A, 223B.

Shunt units 323A, 323B further comprise a diode D1 which is connected in between first shunt sub-unit terminal and third shunt sub-unit terminal 3. Diode D1 is configured to, in forward mode, to provide an electrical path that is opposite to the abovementioned electrical path. For example, for shunt units 323A, 323A, the electrical path extends from first shunt sub-unit terminal 1 to third shunt sub-unit terminal 3. For that reason, the anode of D1 is connected to third shunt sub-unit terminal 3 and the cathode of D1 is connected to first sub-unit terminal 1. For shunt unit 323B the situation is reversed.

Figure 4:
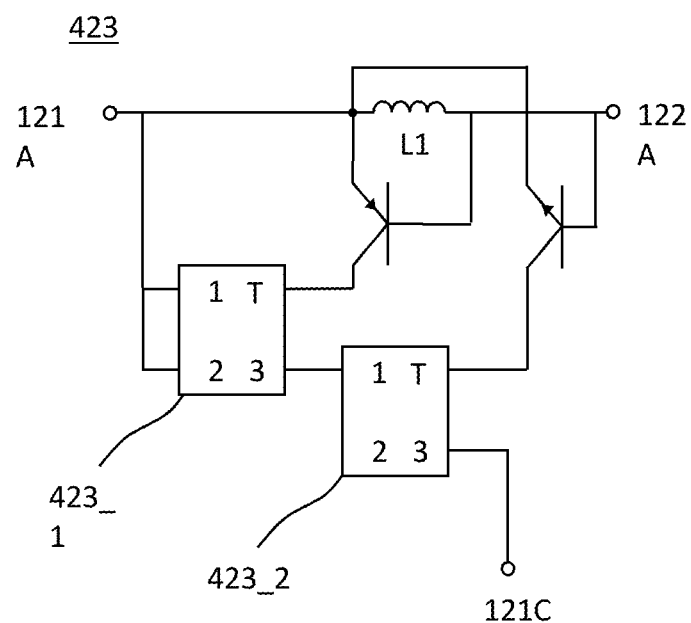
FIG. 4 illustrates an embodiment of a protection device in accordance with an aspect of the present disclosure in which a series combination of a pair of shunt sub-units is employed.

The addition of diode D1 allows the single shunt sub-units of shunt unit 323A, 323B to be arranged in series. For example, third shunt sub-unit terminal 3 of the shunt sub-unit of shunt unit 323A can be connected to first shunt sub-unit terminal 1 of shunt unit 323B. This is shown in FIG. 4. In this figure, shunt unit 423 comprises a first shunt sub-unit 423_1 and a second shunt sub-unit 423_2, wherein shunt sub-unit 423_1 is configured similar to shunt unit 323A and shunt sub-unit 423_1 similar to shunt unit 323B, with the exception of the external triggering formed by Q3, which in FIG. 4, is shared among shunt sub-units 423_1, 423_2.

During a positive ESD event, shunt sub-unit 423_1 will provide an electrical path while diode D1 is reverse biased, whereas diode D1 of shunt sub-unit 423_2 will be forward biased. For negative ESD events, the situation is reversed with diode D1 of shunt sub-unit 423_1 being forward biased and shunt sub-unit 423_2 providing an electrical path as described for shunt unit 323B.

When shunt sub-units 323A, 323B are not arranged in series, diodes D1 can be omitted. Furthermore, instead of arranging the shunt sub-units in series, they can also be arranged in parallel.

In the embodiments described above, a first and/or second inductor were used for generating a voltage. This voltage was subsequently used for enabling an electrical path for guiding away current during an ESD or EMI event. According to an aspect of the present disclosure, a first resistor and/or a second resistor can be used instead of the first inductor and/or second inductor, respectively. According to this aspect of the present disclosure, these resistors have resistance values that increase when the current through the resistors increases. This increase in resistance value should be considerable such that under normal working conditions, the resistors do not or hardly impact the exchange of data. However, in case of an ESD or EMI event, when current levels are relatively high, the resistance values should be much higher such that the voltages needed for providing the electrical paths to ground are generated quickly. For example, the data line(s) can be configured to carry a given maximum current during normal operation. The resistance value of the resistor(s) under these conditions can be equal to or less than a first resistance value. However, during an ESD or EMI event, when the current(s) reach(es) values that is/are m times larger than the abovementioned maximum current, the resistance value of the resistor(s) can be equal to or more than n times the first resistance value. Here, m may lie in the range between 5 and 100, and n may be larger than 2.

In the above, the present disclosure has been described using detailed embodiments thereof. However, the present disclosure is not limited to these embodiments. Instead, various modifications are possible without departing from the scope of the present disclosure which is defined by the appended claims and their equivalents.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalization thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A protection device for protecting an electrostatic discharge (ESD), sensitive device, the ESD sensitive device being electrically connected to at least one among a first data line and a second data line;

wherein the protection device is configured for protecting the ESD sensitive device against an electromagnetic interference (EMI), event and/or an ESD event occurring on the first data line and/or second data line;

wherein the protection device comprises:

a first inductor via which the first data line is electrically connected to a first data terminal of the ESD sensitive device, and/or a second inductor via which the second data line is electrically connected to a second data terminal of the ESD sensitive device; and a first shunt unit configured to provide an electrical path to ground for a current on the first data line in dependence of a first voltage over the first inductor, and/or a second shunt unit configured to provide an electrical path to ground for a current on the second data line in dependence of a second voltage over the second inductor;

wherein at least one of the first shunt unit and/or the second shunt unit comprise at least one shunt sub-unit including a first sub-unit terminal and a second sub-unit terminal;

wherein the first inductor is connected in between the first sub-unit terminal and the second shunt sub-unit terminal of the at least one shunt sub-unit of the first shunt unit; and/or wherein the second inductor is connected in between the first sub-unit terminal and the second shunt sub-unit terminal of the at least one shunt sub-unit of the second shunt unit; and wherein the at least one shunt sub-unit of the first shunt unit or the second shunt unit comprises a bipolar transistor that is connected to the first sub-unit terminal and to the second shunt sub-unit terminal.

2. The protection device according to claim 1, wherein the first inductor and second inductor jointly form or are part of a common mode choke (CMC).

3. The protection device according to claim 2, wherein the first shunt unit is configured to provide the electrical path to ground if the first voltage exceeds or has exceeded a first threshold voltage; and/or wherein the second shunt unit is configured to provide the electrical path to ground if the second voltage exceeds or has exceeded a second threshold voltage.

4. The protection device according to claim 1, wherein the first shunt unit is configured to provide the electrical path to ground if the first voltage exceeds or has exceeded a first threshold voltage; and/or wherein the second shunt unit is configured to provide the electrical path to ground if the second voltage exceeds or has exceeded a second threshold voltage.

5. The protection device according to claim 1, wherein the first shunt unit is configured to provide the electrical path to ground if the first voltage drops or has dropped below a third threshold voltage; and/or wherein the second shunt unit is configured to provide the electrical path to ground if the second voltage drops or has dropped below a fourth threshold voltage.

6. The protection device according to claim 1, comprising:

a first input terminal electrically connected to the first data line and a first output terminal electrically connected to the first data terminal of the ESD sensitive device, wherein the first inductor is arranged in between the first input terminal and the first output terminal; and/or a second input terminal electrically connected to the second data line and a second output terminal electrically connected to the second data terminal of the ESD sensitive device, wherein the second inductor is arranged in between the second input terminal and the second output terminal; and wherein the protection device further comprises a ground terminal configured to be electrically grounded during operation.

7. The protection device according to claim 1, wherein the first shunt unit and/or the second shunt unit further comprises a device selected from the group consisting of: a silicon-controlled rectifier (SCR), a silicon-controlled switch (SCS), a thyristor, and a triac.

8. The protection device according to claim 7, wherein the bipolar transistor of at least one shunt sub-unit of the first shunt unit or the second shunt unit comprises a first bipolar transistor and a second bipolar transistor, wherein:

an emitter contact of the first bipolar transistor is connected to the first sub-unit terminal;

a base contact of the first bipolar transistor is connected to the second shunt sub-unit terminal via a first resistor and to a collector contact of the second bipolar transistor;

a collector contact of the first bipolar transistor is connected to a base contact of the second bipolar transistor;

wherein the base contact of the second bipolar transistor is connected to a third shunt sub-unit terminal via a second resistor;

an emitter contact of the second bipolar transistor is connected to the third shunt sub-unit terminal; and wherein the shunt sub-units are each configured to provide an electrical path for a current on the first or second data line that extends through a base-emitter junction of the first bipolar transistor and crosses between the collector and emitter contacts of the second bipolar transistor.

9. The protection device according to claim 8, wherein the third shunt sub-unit terminal is configured to be grounded during operation for a given shunt sub-unit among the at least one shunt sub-unit of the first shunt unit; and wherein the third shunt sub-unit terminal is configured to be grounded during operation for a given shunt sub-unit among the at least one shunt sub-unit of the second shunt unit.

10. The protection device according to claim 9, wherein the first inductor is connected in between the first and second shunt sub-unit terminals of the given shunt sub-unit for a given shunt sub-unit among the at least one shunt sub-unit of the first shunt unit; and/or wherein the second inductor is connected in between the first and second shunt sub-unit terminals of the given shunt sub-unit for a given shunt sub-unit among the at least one shunt sub-unit of the second shunt unit.

11. The protection device according to claim 8, wherein the first inductor is connected in between the first and second shunt sub-unit terminals of a given shunt sub-unit of the at least one shunt sub-unit of the first shunt unit; and/or wherein the second inductor is connected in between the first and second shunt sub-unit terminals of a given shunt sub-unit of the at least one shunt sub-unit of the second shunt unit.

12. The protection device according to claim 8, wherein the first shunt unit is configured to provide the electrical path to ground if the first voltage exceeds or has exceeded a first threshold voltage; and/or wherein the second shunt unit is configured to provide the electrical path to ground if the second voltage exceeds or has exceeded a second threshold voltage;

wherein the first shunt unit comprises a respective triggering unit for each of the at least one shunt sub-unit of the first shunt unit;

wherein the triggering units are each configured to provide and/or extract a triggering current at the base contact of the second bipolar transistor of the respective shunt sub-unit independent of a voltage over the first inductor being greater than the first threshold voltage or smaller than the third threshold voltage; and/or wherein the second shunt unit comprises a respective triggering unit for each of the at least one shunt sub-unit of the second shunt unit, the triggering units each being configured to provide and/or extract a triggering current at the base contact of the second bipolar transistor of the respective shunt sub-unit in dependence of a voltage over the second inductor being greater than the second threshold voltage or smaller than the fourth threshold voltage;

wherein the triggering units comprise a third bipolar transistor of which the collector contact is connected to the base contact of the relevant second bipolar transistor, and wherein the first inductor is arranged in between an emitter contact and base contact of the third bipolar transistor, or wherein the triggering unit comprises a metal-oxide semiconductor (MOS), transistor of which the drain contact is connected to the base contact of the relevant second bipolar transistor; and wherein the first inductor is arranged in between a source contact and a gate contact of the MOS transistor.

13. The protection device according to claim 8, wherein the first shunt unit is configured to provide the electrical path to ground if the first voltage drops or has dropped below a third threshold voltage; and/or wherein the second shunt unit is configured to provide the electrical path to ground if the second voltage drops or has dropped below a fourth threshold voltage;

wherein the first shunt unit comprises a respective triggering unit for each of the at least one shunt sub-unit of the first shunt unit;

wherein the triggering units are each configured to provide and/or extract a triggering current at the base contact of the second bipolar transistor of the respective shunt sub-unit in dependence of a voltage over the first inductor being greater than the first threshold voltage or smaller than the third threshold voltage; and/or wherein the second shunt unit comprises a respective triggering unit for each of the at least one shunt sub-unit of the second shunt unit, the triggering units each being configured to provide and/or extract a triggering current at the base contact of the second bipolar transistor of the respective shunt sub-unit in dependence of a voltage over the second inductor being greater than the second threshold voltage or smaller than the fourth threshold voltage;

wherein the triggering units comprise a third bipolar transistor of which the collector contact is connected to the base contact of the relevant second bipolar transistor, and wherein the first inductor is arranged in between an emitter contact and base contact of the third bipolar transistor, or wherein the triggering unit comprises a metal-oxide semiconductor (MOS), transistor of which the drain contact is connected to the base contact of the relevant second bipolar transistor; and wherein the first inductor is arranged in between a source contact and a gate contact of the MOS transistor.

14. The protection device according to claim 8 comprising:

a first input terminal electrically connected to the first data line and a first output terminal electrically connected to the first data terminal of the ESD sensitive device;

wherein the first inductor is arranged in between the first input terminal and the first output terminal; and/or a second input terminal electrically connected to the second data line and a second output terminal electrically connected to the second data terminal of the ESD sensitive device;

wherein the second inductor is arranged in between the second input terminal and the second output terminal;

wherein the protection device further comprises a ground terminal configured to be electrically grounded during operation;

wherein the first shunt unit comprises a single shunt sub-unit, the first shunt sub-unit terminal being connected to the first input terminal, the second shunt sub-unit terminal to the first output terminal, and the third shunt sub-unit terminal to the ground terminal; and wherein the second shunt unit comprises a single shunt sub-unit, the first shunt sub-unit terminal being connected to the second input terminal, the second shunt sub-unit terminal to the second output terminal, and the third shunt sub-unit terminal to the ground terminal.

15. The protection device according to claim 8, wherein the shunt sub-units comprise a diode arranged in between the first or second shunt sub-unit terminal and the third shunt sub-unit terminal;

wherein the diode is configured to provide an additional electrical path in forward mode of the diode that is opposite in direction to the electrical path provided by shunt sub-unit;

wherein at least one of the first and second shunt unit comprises a series combination of a pair of shunt sub-units; and wherein the diodes of these shunt sub-units are oppositely arranged.

16. A system, comprising:

a physical layer (PHY) device having a first data terminal and/or a second data terminal;

a first data line and/or a second data line by which the first and/or second data terminal of the PHY device can be connected to a further device, respectively, for exchanging data with the PHY device; and the protection device according to claim 1, for protecting the PHY device against an electromagnetic interference (EMI), event and/or an ESD event occurring on at least one of the first and second data line.

17. The system according to claim 16, further comprising:

one or more first further protection devices connected to the first and/or second data terminal and arranged in between the protection device and the PHY device, the system further comprising DC blocking capacitors arranged in between the one or more first protection devices and the protection device; and/or a printed circuit board on which the protection device and the PHY device are mounted;

wherein the protection device and/or the PHY device are provided, at least in part, as a bare semiconductor die that is flip-chipped or wire bonded to the printed circuit board; and/or wherein the first inductor and/or second inductor are integrated on a same semiconductor die as the first and/or second shunt units, respectively;

wherein the first and/or second shunt units are integrated on the same semiconductor die; and/or wherein the system further comprises one or more second protection devices arranged in the PHY device and connected to the first and/or second data terminals.

18. The system according to claim 17, wherein the first inductor and second inductor jointly form or are part of a common mode choke (CMC);

wherein the PHY device comprises the first data terminal and the second data terminal; and wherein the PHY device is configured to exchange data with the further device based on differential signaling.

19. The system according to claim 16, wherein the first inductor and second inductor jointly form or are part of a common mode choke (CMC);
  wherein the PHY device comprises the first data terminal and the second data terminal; and
  wherein the PHY device is configured to exchange data with the further device based on differential signaling.

* * * * *